(12) United States Patent
Granestrand et al.

(10) Patent No.: US 6,914,924 B2
(45) Date of Patent: Jul. 5, 2005

(54) OPTICAL DEVICE AND FABRICATION THEREOF

(75) Inventors: Per Granestrand, Tyresö (SE); Stefan Bjurshagen, Bandhagen (SE); Åsa Björkström, Järfälla (SE); Lennart Lundqvist, Kista (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 180 days.

(21) Appl. No.: 09/898,018

(22) Filed: Jul. 5, 2001

(65) Prior Publication Data

US 2002/0003825 A1 Jan. 10, 2002

(30) Foreign Application Priority Data

Jul. 7, 2000 (SE) .............................................. 0002580

(51) Int. Cl.⁷ ................................................. H01S 5/00
(52) U.S. Cl. ............................ 372/50; 372/50; 372/26; 372/103; 372/99
(58) Field of Search .............................. 372/23, 50, 99, 372/103, 26

(56) References Cited

U.S. PATENT DOCUMENTS

| | | | |
|---|---|---|---|
| 4,070,681 A | * | 1/1978 | Ichikawa et al. .......... 347/255 |
| 4,740,987 A | | 4/1988 | McCall, Jr. et al. |
| 4,901,123 A | | 2/1990 | Noguchi et al. |
| 5,223,722 A | | 6/1993 | Nagai et al. |
| 5,917,972 A | | 6/1999 | Davies |
| 5,995,692 A | | 11/1999 | Hamakawa et al. |
| 6,091,755 A | | 7/2000 | Sanders et al. |
| 6,137,619 A | * | 10/2000 | Chen et al. ................. 359/251 |
| 6,381,056 B1 | * | 4/2002 | Ellis ........................... 398/183 |
| 6,512,860 B2 | * | 1/2003 | Bischoff et al. .............. 385/2 |
| 6,542,533 B1 | * | 4/2003 | Parayanthal .................. 372/64 |

FOREIGN PATENT DOCUMENTS

| | | |
|---|---|---|
| EP | 0637111 A1 | 2/1995 |
| EP | 0851548 A1 | 7/1998 |
| EP | 895326 A1 | 7/1998 |
| JP | 07020359 | 1/1995 |
| JP | 10300959 | 11/1998 |
| JP | 11046040 | 2/1999 |
| SE | 9902916-7 | 2/2001 |

OTHER PUBLICATIONS

P. Ojala, C. Pettersson, B. Stoltz, A.–C. Momer, M. Janson, O. Sahlen: "Low residual–reflectance, low–chirp integrated Franz–Keldysh modulator and DFB laser", Proceedings of the European Conference on Optical Communication, pp. 321–324, Montreux, Switzerland, 1993.

* cited by examiner

*Primary Examiner*—Minsun Oh Harvey
*Assistant Examiner*—Delma R. Flores Ruiz
(74) *Attorney, Agent, or Firm*—Burns, Doane, Swecker & Mathis, L.L.P.

(57) ABSTRACT

An optical device has a back facet (27) and a front facet (29; 29') opposite to each other, and includes a laser (23) adapted to emit light essentially perpendicular to said back facet; a modulator (25; 51; 55) having an input end and an output end (35; 53; 57), respectively, and adapted to receive and modulate light emitted from said laser and to output modulated light at said modulator output end; and a window region (33) arranged between said modulator output end and said device front facet, said device being further arranged such that modulated light output from said modulator is transmitted through said window region and is output from said device through said device front facet. The modulator is bent such that the modulated light output from said modulator is propagating essentially in a direction (34), which is angled ($\alpha$; $\delta$) with respect to the normal (Z; 71) of said device front facet.

17 Claims, 2 Drawing Sheets

OPTICAL DEVICE AND FABRICATION THEREOF

TECHNICAL FIELD OF THE INVENTION

The present invention generally relates to the field of fiber optic communications. More specifically, the invention relates to an optical device comprising a laser and a modulator, and to a method for the fabrication of such optical device.

DESCRIPTION OF RELATED ART AND BACKGROUND OF THE INVENTION

In many fiber-optic systems application the demands on the light source are very stringent. Specifically, one needs good spectral purity in order to transmit high bit rate information over long distances. During laser modulation, a minimum level of spectral broadening necessarily occurs. Chirp, however, is an excess of spectral broadening beyond the spectral width required for modulation. Because different wavelengths propagate at different speeds in a dispersive medium, such as an optical fiber, the presence of significant chirp causes greater pulse spreading for a modulated optical signal transmitted across a fiber optic network.

Thus, reducing chirp has long been desired in optical communication. Low-chirp modulated laser sources are especially necessary in long-haul, high bit rate optical fiber transmission systems where chirp-induced pulse distortion reduces performance and range.

Two general approaches are typically used to modulate laser light: direct modulation and external modulation. In direct modulation, a laser such as a laser diode is directly modulated by an information signal to generate a modulated laser output. In external modulation, a modulator is used to modulate light from a laser source such as a laser diode. An information signal is then applied to the modulator rather than to the laser as in direct modulation. The frequency deviation (chirp) from external modulation is usually much lower than what can be achieved from a directly modulated laser, especially if a high extinction ratio of the transmitted light signal is required, despite the fact that chirp may arise from electrical and optical interactions between the laser and the modulator.

In external modulation, two different arrangements are commonly used for connecting the external modulator with respect to the laser source. In the first arrangement, the modulator and laser are disposed on separate, discrete substrates and in the second arrangement, the modulator and laser are fabricated as an integrated laser-modulator device on a single chip.

In the first arrangement, optical interactions between the laser and the modulator can be reduced by optically isolating the discrete laser and modulator from each other by means of e.g. an optical isolator arranged between the laser and the modulator, said optical isolator allowing light to travel in one direction only.

In the second arrangement, the laser and the modulator are fabricated on a single chip such that an interconnected laser-modulator is obtained. It is, however, complex and costly, if not impossible, to integrate an optical isolator with a laser and a modulator on a chip.

However, to reduce cost, complexity and size it is often desirable to use the second arrangement, i.e. the integrated combination of a laser and a modulator, and to reduce the optical interactions and thus the chirp by means of other approaches than using an optical isolator.

In FIG. 1 is shown, schematically, a top view of a typical integrated laser/modulator according to the prior art. A laser section 1 and a modulator section 3 are formed on a substrate 5 having a back facet 7 and a front facet 9. In order to obtain good performance using such an integrated arrangement, it is required that the internal reflexes on the chip can be reduced to very low levels since light reflected back to the laser will disturb the laser and cause chirp and other problems.

To reduce the back reflections in the modulator a so called window structure 11 is formed between the output end 13 of the modulator 3 and the front facet 9. The window region, being e.g. 15 microns long, consists typically of InP, and is arranged for free light propagation. Due to the divergence of the light output from modulator 3 the light reflected at front facet 9, which is coupled back into the waveguide, is reduced. Further, to reduce the reflectivity at front facet 9, typically an anti-refection (AR) coating 15 is formed thereon. It is important to keep a good coupling efficiency in the arrangement, and this complicates the procedures for reducing reflections back into the laser section.

The suppression of internal reflexes of such a conventional device, however, is in many instances not sufficient, which results in poor yield in the fabrication of such integrated modulator/laser devices.

The reflexes originate both from the on-chip modulator waveguide termination 13 and from residual reflections from the AR-coated front facet 9, which find their way back into the waveguide.

SUMMARY OF THE INVENTION

It is a main object of the present invention to provide an optical device comprising a laser and a modulator, wherein internal reflexes are reduced.

It is in this respect a particular object of the invention to provide such optical device, wherein optical interactions between the laser section and the modulator section are reduced.

It is still a further object of the invention to provide such optical device, which simultaneously exhibits a good coupling efficiency.

It is yet a further object of the invention to provide such optical device, which is simple, of low cost, and compact in size.

These objects among others are, according to a first aspect of the present invention, attained by an optical device having a back facet and a front facet opposite to each other, the device including a laser, a modulator, and a window region. The laser is adapted to emit light essentially perpendicular to the back facet. The modulator has an input end and an output end, and is adapted to receive and modulate light emitted from the laser and to output modulated light at the modulator output end. The window region is arranged between the modulator output end and the device front facet such that modulated light output from the modulator is transmitted through the window region and is output from the device through the front facet. The modulator is bent such that the modulated light output from the modulator is propagating essentially in a direction, which is angled with respect to the normal of the front facet.

By such provision any light reflected at the front facet is directed away from the modulator output end, instead of being reflected back towards it, such that back reflections from the front facet are effectively prevented from entering the modulator and the laser, whereby the chirp is reduced.

The above mentioned objects are, according to a second aspect of the present invention, attained by an optical device having a back facet and a front facet opposite to each other, said device including a laser, a modulator and a window region. The laser is adapted to emit light. The modulator has an input end and an output end, respectively, and is adapted to receive and modulate light emitted from the laser and to output modulated light at the modulator output end. The window region is arranged between the modulator output end and the device front facet such that modulated light output from the modulator is transmitted through the window region and is output from the device through the device front facet. Further, the device is arranged such that the modulated light output from the modulator is propagating essentially in a direction, which is angled with respect to the normal of the device front facet. Finally, the modulator output end is tapered.

By such provisions the light, which is reflected at the modulator output end, is reduced. Further, the tapered modulator output end is also effective to improve the coupling efficiency by narrowing the angular spread of the light output from the modulator. The combination of the angled incidence onto the front facet and the tapered modulator output further reduces the light reflected at the front facet, which is reflected back into the modulator. Thus, the chirp is further reduced.

By combination of the two first aspects of the invention an optical device may be obtained, wherein back scattered light is prevented from entering the modulator and wherein the bent modulator and the inclined front facet may be designed such that the light output from the device is propagating essentially in a direction parallel with the propagation direction of the light emitted from the laser.

A further object of the present invention is to provide methods for the fabrication of the optical devices according to the first and second aspects of the invention.

In this respect, there is a particular object of the invention to provide such fabrication methods that provide for higher yields.

Thus, according to a third aspect of the present invention, there is provided a method for the fabrication of an optical device comprising the steps of (i) providing a substrate having a back facet and a front facet opposite to each other; (ii) forming a laser in or on said substrate, the laser being adapted to emit light essentially perpendicular to the back facet; (iii) forming a modulator with an input end and an output end, respectively, in or on said substrate, the modulator being adapted to receive and modulate light emitted from the laser and to output modulated light at the modulator output end; and (iv) forming a window region between the modulator output end and the device front facet such that modulated light output from the modulator can be transmitted through the window region and be output from the device through the device front facet. Further, the modulator is formed with a bend such that the modulated light output from the modulator is propagating essentially in a direction, which is angled with respect to the normal of the device front facet.

Finally, according to a fourth aspect of the present invention, there is provided a method for the fabrication of an optical device comprising the steps of: (i) providing a substrate having a back facet and a front facet opposite to each other; (ii) forming a laser in or on said substrate, the laser being adapted to emit light; (iii) forming a modulator with an input end and an output end, respectively, in or on said substrate, the modulator being adapted to receive and modulate light emitted from the laser and to output modulated light at the modulator output end; and (iv) forming a window region between the modulator output end and the device front facet such that modulated light output from the modulator can be transmitted through the window region and be output from the device through the device front facet. The steps of forming the substrate, the laser, the modulator and the window region are performed such that the modulated light output from the modulator is propagating essentially in a direction, which is angled with respect to the normal of the device front facet. Further, the modulator is formed with a tapered output end.

An advantage of the present invention is that low internal reflexes and a good coupling efficiency are simultaneously obtained.

Further characteristics of the invention and advantages thereof will be evident from the following detailed description of embodiments of the invention.

BRIEF DESCRIPTION OF THE DRAWINGS

The present invention will become more fully understood from the detailed description of embodiments of the present invention given hereinbelow and the accompanying FIGS. 1–4, which are given by way of illustration only, and thus are not limitative of the present invention.

DETAILED DESCRIPTION OF EMBODIMENTS

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

Figure 2:
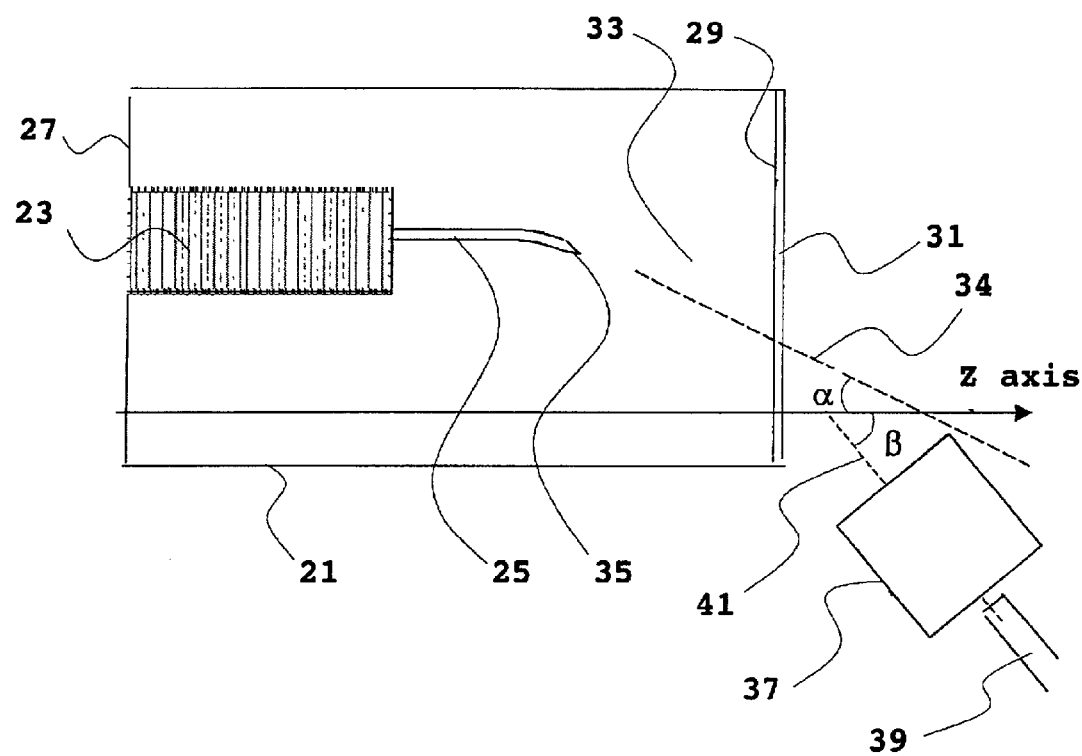
FIG. 2 illustrates, schematically, a top view of an integrated laser/modulator device according to a first embodiment of the present invention.

With reference to FIG. 2, which schematically illustrates a top view of an integrated laser/modulator device, a first embodiment of the present invention will be depicted.

The integrated laser/modulator device comprises a substrate 21, in which a laser section 23 and a modulator section 25 are formed. The laser 23 is typically some kind of DFB (distributed feedback) laser, but may be any kind of suitable laser, e.g. a DBR (distributed Bragg reflection) laser. The modulator 25 is preferably an EAM (electro-absorption modulator), in which the waveguide has a bulk or a quantum well structure and the waveguide may be a buried or a ridge waveguide. Alternatively, the modulator is of other kind such as e.g. a Mach-Zehnder modulator.

The device is preferably fabricated in the material system $InP/In_{1-x}Ga_xAs_yP_{1-y}$, but other material systems may be used.

Further, the device comprises a back facet 27 and a front facet 29 opposite to each other. Preferably, both facets are planar and parallel to each other such that a Z-axis indicated in FIG. 2 constitutes a normal to both surfaces. Back facet 27 may be used as a reflecting means in the laser section, particularly in the case the laser is a DFB, and may be provided with a high reflection (HR) coating (not illustrated). Front facet 29, through which the modulated light is output, is preferably provided with an AR coating 31. A window region 33 is provided between the modulator 25 and the device front facet 29.

According to the invention, the modulator 25 is curved such that light emitted by laser 23 along the Z axis and modulated by modulator 25 during operation, is output into window region 33 in a direction, schematically indicated by 34 in FIG. 2, which forms an angle α with respect to the normal of the device front facet, i.e. the Z axis. The bend radius of the modulator is typically about 500 micrometers. The angle α is preferably at least 2°, more preferably at least 5°, and most preferably at least or around 8°. An upper limit is the angle for total reflection, which depends on the refractive index of the window region 33, the AR coating 31 and the surrounding air. Typical values of the upper limit are 15–20°.

By such design, i.e. terminating the waveguide in a bend instead of in a straight fashion so that the tip or output end 35 of the modulator waveguide will form the angle α with the z-axis, it is possible to reduce the light reflections back into the waveguide. This may be understood by a geometrical consideration: the light will enter the window region 33 at essentially the angle α relative to the Z axis and the light reflected at the front facet 29 (including AR coating 31) will, due to this angle, to a great extent be deflected away from the waveguide output end. This will suppress the reflection from the front facet (including AR coating).

Further, the waveguide is preferably terminated in a tapered fashion which typically means that the width and/or thickness of the waveguide is gradually reduced to zero, or to close to zero, over a region typically 20–50 microns long. This will, inter alia, reduce the reflex stemming from the waveguide termination 35 since the waveguide discontinuity will be smeared out over a distance, which is large compared to the light wavelength in the material. Also the shape of the field will be altered due to this tapering, the consequences of which will be discussed below with reference to FIG. 3.

Finally, an out-coupling device 37, which typically is a lens-isolator-combination that couples the light into an optical fiber 39, is positioned (i.e. the optical axis 41 of device 37) at an angle β relative to the Z axis in order to maximize the coupling efficiency from the integrated laser/modulator component. The appropriate angle β is essentially given by Snell's law and can in a typical situation be in the order of 30° degrees (with less than 10° deviation (α) from the Z axis at the waveguide termination 35).

The integrated laser/modulator device, the out-coupling device and optionally a fiber connection may be mounted in a module or package.

Figure 3:
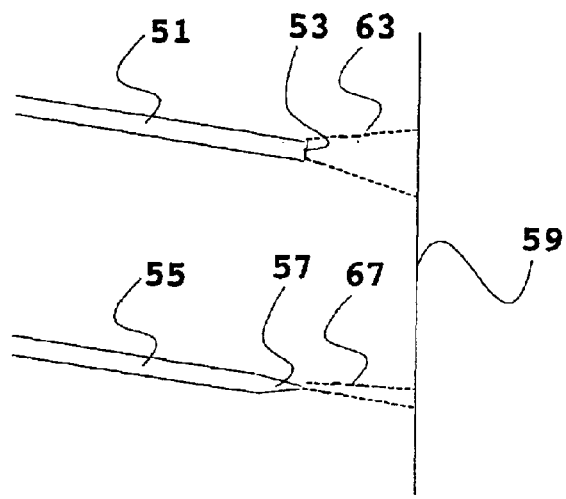
FIG. 3 are schematic partial top views of a modulator having an abrupt output end and a modulator having a tapered output end, respectively, arranged in an angled fashion with respect to a front facet, said views particularly illustrating the benefits of a tapered modulator output end.

Turning now to FIG. 3, which are schematic partial top views of a modulator 51 having an abrupt output end 53 and a modulator 55 having a tapered output end 57, respectively, arranged in an angled fashion with respect to a front facet 59, the benefits of a tapered modulator output end will be discussed.

As a consequence of the tapering of the waveguide the light field at the output of the tapered region will be transversally expanded. This in turn will imply that the angular spread in the diffraction in the window will be smaller than what would the case if no tapering took place. The angular spreads of the light output from the abrupt 53 and tapered 57 output ends are schematically indicated by 63 and 67 in FIG. 3.

A smaller angular spread means that the coupling efficiency will be improved.

Further, a particularly advantageous effect of the combination of a bent modulator and a tapered modulator output end is that less light will be present in the angular distribution at the output of the tapered modulator end 57 at angles that would to a great extent be reflected back into the modulator waveguide. This is in contrast to the case of a straight modulator from which modulated light is incident perpendicular to the front facet, in which case a smaller angular spread results in more light being reflected back into the modulator.

Figure 4:
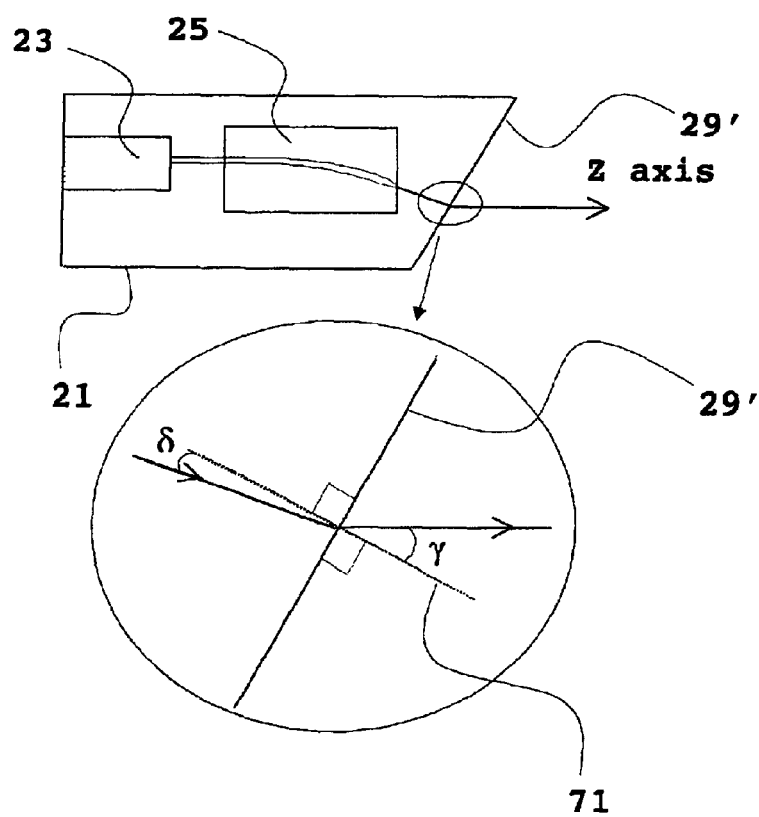
FIG. 4 illustrates, schematically, a top view of an integrated laser/modulator according to a second embodiment of the present invention, wherein an enlargement of the front facet is shown in inset.

Next, with reference to FIG. 4, which is a schematic top view of an integrated laser/modulator device, wherein an enlargement of the front facet is shown in inset, a second embodiment of the present invention will be depicted.

Figure 1:
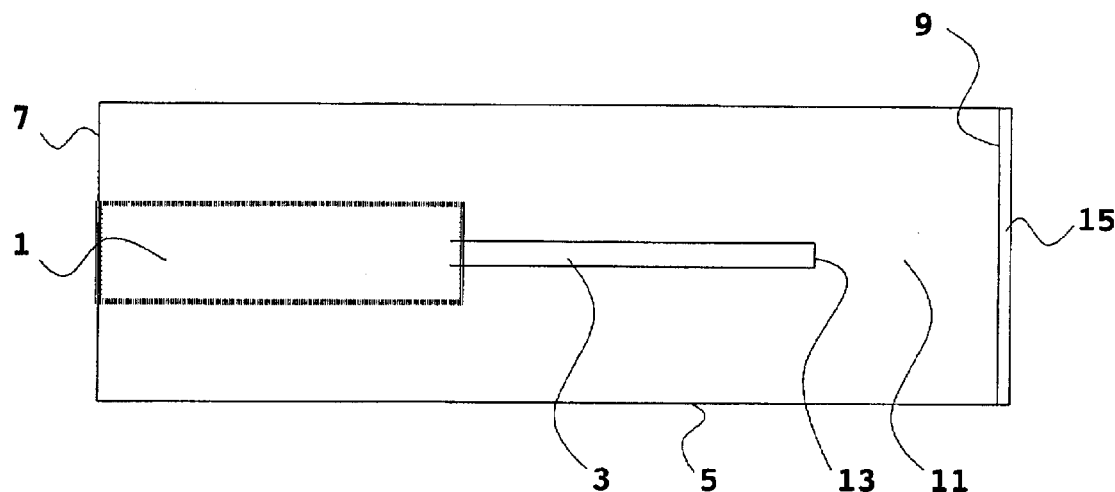
FIG. 1 illustrates, schematically, a top view of an integrated laser/modulator device according to the prior art.

The device of this second embodiment is identical with the embodiment of FIG. 2 except that the device front facet, in FIG. 4 denoted 29', is angled with respect to the Z axis instead of positioning any external out-coupling device at an angle with respect to the Z axis. All other parts of the device have the same reference numerals as they have in FIG. 1. Also in this embodiment an AR coating (not illustrated) may cover the front facet.

The front facet 29' may be angled with respect to the Z axis by using any suitable technique such as e.g. dry etching. The angle γ of the dry-etched window termination is essentially given by Snell's law (to give an output coupling parallel with the Z axis).

It shall particularly be noted that in this embodiment one preferably use modulator bends of larger or much larger angles (i.e. angle α in FIG. 2) since the dry-etched angled front facet 29' reduces the angle (δ) between the light propagation direction and the normal (71) of the device front facet.

It shall be noted that the tapered modulator end according to the present invention has a threefold advantageous effect when being combined with an angled incidence onto the device front facet: firstly, the reflections at the modulator end are reduced; secondly, the out-coupling efficiency is improved; and thirdly, the reflections back into the modulator from the front facet are reduced. It shall be appreciated that these features may be obtained without the provision of a bent modulator.

For instance, the device front facet may be angled with respect to the Z axis as in the second embodiment while the modulator, provided with a tapered output end, is straight (without bends). The angled light incidence onto the device front facet is then given by the front facet inclination only.

In another version a straight laser/modulator arrangement with a tapered modulator output end may be arranged diagonally on a substrate.

By the principles of the present invention better performance with respect to reflexes in integrated laser/modulator devices is obtained.

The present invention provides for the opportunity to obtain low internal reflexes in an integrated modulator/laser without improbable demands on the AR coating. At the same time good coupling efficiency can be obtained. The inventive features of the present invention have potential to successfully reduce both reflexes from the waveguide termination and residual facet reflexes.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. An optical device having a back facet and a front facet opposite to each other, said device including:
   a laser adapted to emit light;
   a modulator having an input end and an output end, respectively, and adapted to receive and modulate light emitted from said laser and to output modulated light at said modulator output end; and
   a window region arranged between said modulator output end and said device front facet;
   said device being further arranged such that modulated light output from said modulator is transmitted through said window region and is output from said device through said device front facet, wherein
   said device is arranged such that the modulated light output from said modulator is propagating essentially in a direction, that is angled with respect to a normal of said device front facet; and
   said modulator output end is tapered; and
   said front facet is angled with respect to said back facet such that said modulated light is output from the device via said front facet in a direction substantially parallel with a normal of said back facet.

2. The optical device as claimed in claim 1 wherein the angle between the propagation direction of the light and the normal of said front facet is at least 2°, preferably at least 5°, more preferably at least 8°, and most preferably around 8°.

3. The optical device as claimed in claim 1 wherein the width of said modulator output end is tapered.

4. The optical device as claimed in claim 1 wherein the thickness of said modulator output end is tapered.

5. The optical device as claimed in claim 1 wherein the tapered modulator output end section is between 10 and 1000 microns long, and preferably between 20 and 50 microns long.

6. The optical device as claimed in claim 1 wherein said front facet is provided with an AR coating.

7. The optical device as claimed in claim 1 wherein the device is a monolithically integrated semiconductor device.

8. The optical device as claimed in claim 1 wherein said modulator is bent.

9. The optical device as claimed in claim 1 wherein said modulator is angled with respect to the normal of said front facet.

10. The optical device as claimed in claim 1 wherein said front facet is angled with respect to said back facet.

11. The optical device of claim 1, wherein said modulator is bent to provide said angled direction of the modulated light.

12. The optical device of claim 1, wherein said modulator is angled with respect to the normal of said front facet to provide said angled direction of the modulated light.

13. The optical device of claim 12, wherein said modulator is arranged diagonally in said optical device.

14. The optical device of claim 13, wherein said modulator is straight, and said front facet is angled with respect to said back facet to provide said angled direction of the modulated light.

15. The optical device of claim 1, wherein said angled front facet is dry etched.

16. The optical device of claim 1, wherein said angled front facet is etched.

17. The optical device of claim 1, wherein side edges of said device are substantially parallel with a normal of the back facet.

* * * * *